United States Patent
Harris, Jr.

(10) Patent No.: US 6,328,598 B1
(45) Date of Patent: Dec. 11, 2001

(54) PRINTED CIRCUIT BOARD SUPPORTING DIFFERENT TYPES OF CHASSIS CONNECTOR PANELS

(75) Inventor: James Errol Harris, Jr., Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/556,595

(22) Filed: Apr. 21, 2000

(51) Int. Cl.$^7$ .................................................... H01R 27/00
(52) U.S. Cl. ............................................ 439/516; 439/218
(58) Field of Search ................................. 361/781–792; 439/516, 218, 61; 174/68.5, 254, 255, 258

(56) References Cited

U.S. PATENT DOCUMENTS

| | | | |
|---|---|---|---|
| 4,335,272 | 6/1982 | Pittenger | 174/68.5 |
| 4,459,640 | 7/1984 | Latasiewicz et al. | 361/395 |
| 4,700,880 | 10/1987 | Glover | 228/180.1 |
| 5,099,394 | * 3/1992 | Hood et al. | 361/413 |
| 5,121,297 | * 6/1992 | Haas | 361/398 |
| 5,259,784 | * 11/1993 | Iwatare et al. | 439/377 |
| 5,576,935 | 11/1996 | Freer et al. | 361/785 |

FOREIGN PATENT DOCUMENTS

| | | | |
|---|---|---|---|
| 206123 | 5/1981 | (GB) . | |
| 2160366 | 12/1985 | (GB) . | |
| 5-21926 | * 11/1988 | (JP) | H05K/1/14 |
| 63-278294 | * 11/1988 | (JP) | H05K/1/02 |
| 404162486 | 5/1992 | (JP) . | |

* cited by examiner

Primary Examiner—Brian Sircus
Assistant Examiner—Son V. Nguyen
(74) Attorney, Agent, or Firm—George E. Grosser; Andrew Dillon

(57) ABSTRACT

An improved printed circuit board capable of being received by two different types of connector panels is disclosed. The printed circuit board includes a main board portion, and a breakaway board portion. The main board portion includes a first connector. The breakaway board portion is coupled to the main board portion utilizing perforations. The breakaway board portion includes a second connector. The breakaway board portion is capable of being completely detached from the main board portion. The main board portion is electrically coupled to the breakaway board portion utilizing a flexible ribbon cable. The printed circuit board is capable of being received by either a first or a second type of connector panel. The first type of connector panel includes a first connector receptacle and a second connector receptacle disposed in a first configuration. The first connector receptacle is capable of receiving the first connector, and the second connector receptacle is capable of receiving the second connector when the breakaway board portion remains attached to the main board portion. The second type of connector panel includes a third connector receptacle and a fourth connector receptacle disposed in a second configuration. The third connector receptacle is capable of receiving the first connector, and the fourth connector receptacle is capable of receiving the second connector when the breakaway board portion is detached from the main board portion.

15 Claims, 2 Drawing Sheets

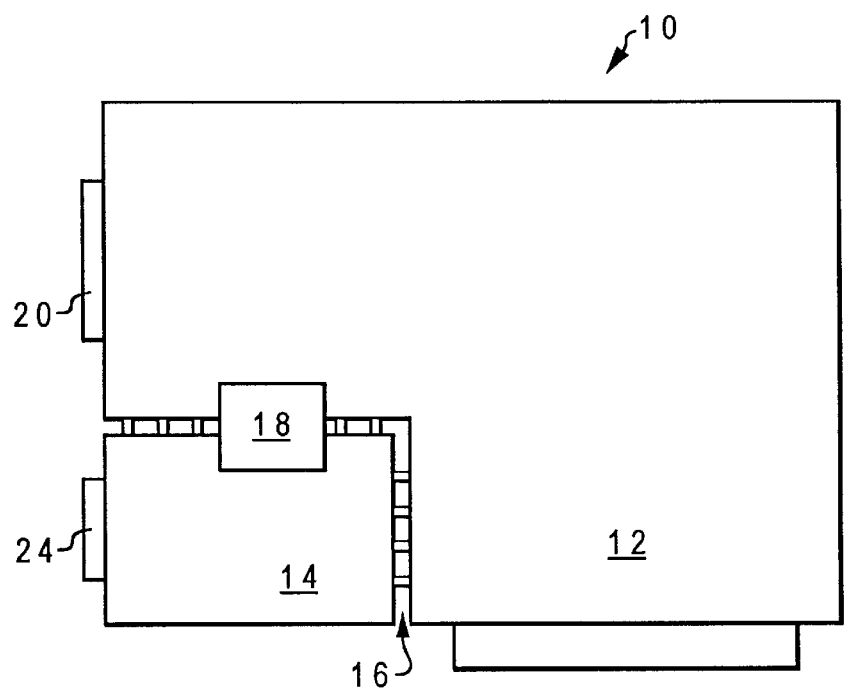
Fig. 2
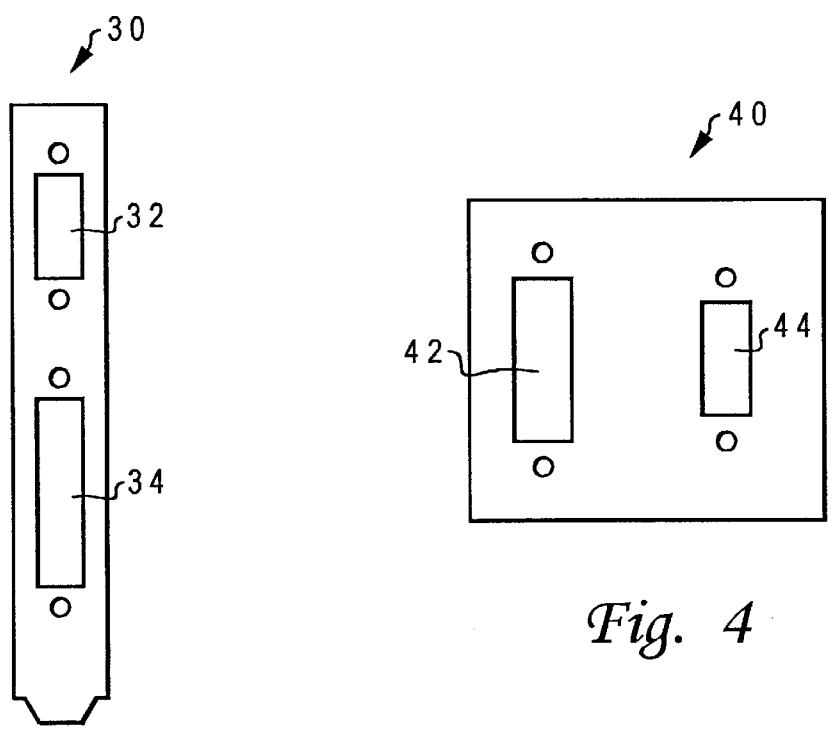
Fig. 3
Fig. 4

PRINTED CIRCUIT BOARD SUPPORTING DIFFERENT TYPES OF CHASSIS CONNECTOR PANELS

BACKGROUND OF THE INVENTION

1. Field of the Invention

The present invention relates in general to printed circuit boards and, in particular, to a printed circuit board construction supporting different types of chassis connector panels. Still more particularly, the present invention relates to a printed circuit board construction including a main board portion and a breakaway board portion, coupled to the main board portion utilizing perforations, for supporting different types of chassis connector panels.

2. Description of the Related Art

A computer system typically includes a graphics card. In the preferred embodiment, the graphics card is an AGP (Accelerated Graphics Port) card. An AGP card may be either an ATX type card, or an NLX type card.

The ATX type card (i.e. ATX AGP card) includes two connectors being received by an ATX connector panel within the computer's chassis. The ATX AGP connectors are disposed vertically, one directly above the other. The NLX type card (i.e. NLX AGP card) includes two connectors being received by an NLX connector panel within the computer's chassis. The NLX connectors are disposed parallel to each other in a side-by-side manner, one approximately horizontally level with the other.

In order to accommodate either standard, a manufacturer of a graphics card must manufacture two different types of cards. The first card is a single printed circuit board, an ATX AGP card, having two connectors, one disposed vertically above the other on an edge of the printed circuit board. The second card is a two printed circuit board construction, an NLX AGP card construction, having two connectors, one on the edge of each printed circuit board. One board is mounted on the other such that the two connectors are disposed parallel to each other in a side-by-side manner with one approximately horizontally level with the other.

It greatly increases the manufacturing costs to manufacture two different printed circuit board constructions, particularly where the boards have the same functionality.

SUMMARY OF THE INVENTION

An improved printed circuit board capable of being received by two different types of connector panels is disclosed. The printed circuit board includes a main board portion, and a breakaway board portion. The main board portion includes a first connector. The breakaway board portion is coupled to the main board portion utilizing perforations. The breakaway board portion includes a second connector. The breakaway board portion is capable of being completely detached from the main board portion. The main board portion is electrically coupled to the breakaway board portion utilizing a flexible ribbon cable. The printed circuit board is capable of being received by either a first or a second type of connector panel. The first type of connector panel includes a first connector receptacle and a second connector receptacle disposed in a first configuration. The first connector receptacle is capable of receiving the first connector, and the second connector receptacle is capable of receiving the second connector when the breakaway board portion remains attached to the main board portion. The second type of connector panel includes a third connector receptacle and a fourth connector receptacle disposed in a second configuration. The third connector receptacle is capable of receiving the first connector, and the fourth connector receptacle is capable of receiving the second connector when the breakaway board portion is detached from the main board portion.

The above as well as additional objectives, features, and advantages of the present invention will become apparent in the following detailed written description.

DESCRIPTION OF THE DRAWINGS

The novel features are set forth in the appended claims. The present invention itself, however, as well as a preferred mode of use, further objectives, and advantages thereof, will best be understood by reference to the following detailed description of a preferred embodiment when read in conjunction with the accompanying drawings, wherein:

FIG. 2 illustrates a side view of the printed circuit board of FIG. 1A having the breakaway board portion attached to the main board portion in accordance with the present invention;

FIG. 3 depicts a front view of a first type of connector panel including a first connector receptacle and a second connector receptacle disposed vertically for coupling to a printed circuit board having a breakaway board portion attached to a main board portion in accordance with the present invention; and FIG. 4 depicts a front view of a second type of connector panel including a third connector receptacle and a fourth connector receptacle disposed side-by-side for coupling to a printed circuit board having a breakaway board portion detached from a main board portion in accordance with the present invention.

DETAILED DESCRIPTION OF A PREFERRED EMBODIMENT

A preferred embodiment of the present invention and its advantages are better understood by referring to FIGS. 1–4 of the drawings, like numerals being used for like and corresponding parts of the accompanying drawings.

The present invention is a single printed circuit board capable of being received by two different types of connector panels. The printed circuit board includes a main board portion and a breakaway board portion coupled to the main board portion utilizing perforations. The main board portion includes a first connector, and the breakaway board portion includes a second connector. When the breakaway board portion remains attached to the main board portion, the printed circuit board is capable of being received by a first type of connector panel included within a first type of computer chassis. When the breakaway board portion is detached from the main board portion, the printed circuit board is capable of being received by a second type of connector panel included within a second type of computer chassis. In this manner, the single printed circuit board may be utilized in either of two different types of computer chassis.

In a preferred embodiment, printed circuit board 10 is a graphics card capable of supporting two different types of graphics connectors in two different types of configurations. A computer system typically includes a graphics card. In the preferred embodiment, the graphics card is an AGP (Accelerated Graphics Port) card.

An AGP card may be either an ATX type card, or an NLX type card. The ATX type card (i.e. ATX AGP card) will include two connectors for coupling the ATX AGP card to a first type of connector panel within the computer's chassis. The ATX AGP connectors are disposed vertically, one directly above the other. The NLX type card (i.e. NLX AGP card) will include two connectors for coupling the NLX AGP card to a second type of connector panel within the computer's chassis. The NLX connectors are disposed parallel to each other in a side-by-side manner, one approximately horizontally level with the other.

Figure 1A:
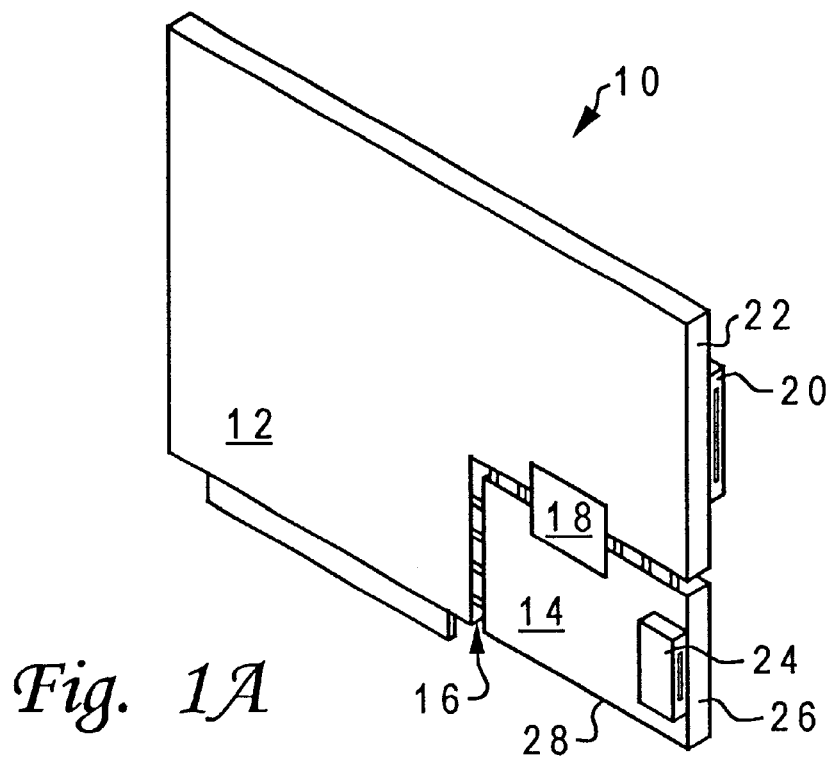
FIG. 1A depicts a perspective view of a printed circuit board including a main board portion coupled to a breakaway board portion utilizing perforations in accordance with the present invention.

FIG. 1A depicts a perspective view of a printed circuit board including a main board portion coupled to a breakaway board portion utilizing perforations in accordance with the method and system of the present invention. Printed circuit board 10 includes a main board portion 12 and a breakaway board portion 14 connected to main board portion 12 utilizing perforations 16. Printed circuit board 10 is capable of being separated into two parts, main board portion 12 and breakaway portion 14, by breaking perforations 16. Breakaway portion 14 may be completed disconnected from main board portion 12. Main board portion 12 is electrically coupled to breakaway board portion 14 utilizing a flexible flat ribbon cable 18. When breakaway board portion 14 is disconnected, or broken apart, from main board portion 12, breakaway board portion 14 remains electrically coupled to main board portion 14 utilizing ribbon cable 18.

A first connector 20 is coupled to a front edge 22 of main board portion 12. Preferably, connector 20 is a VGA type connector for receiving a VGA connector coupled to a monitor cable. A second connector 24 is coupled to a front edge 26 of breakaway board portion 14. Preferably, connector 24 is a flat panel type connector for receiving a flat panel connector coupled to a monitor cable.

Figure 1B:
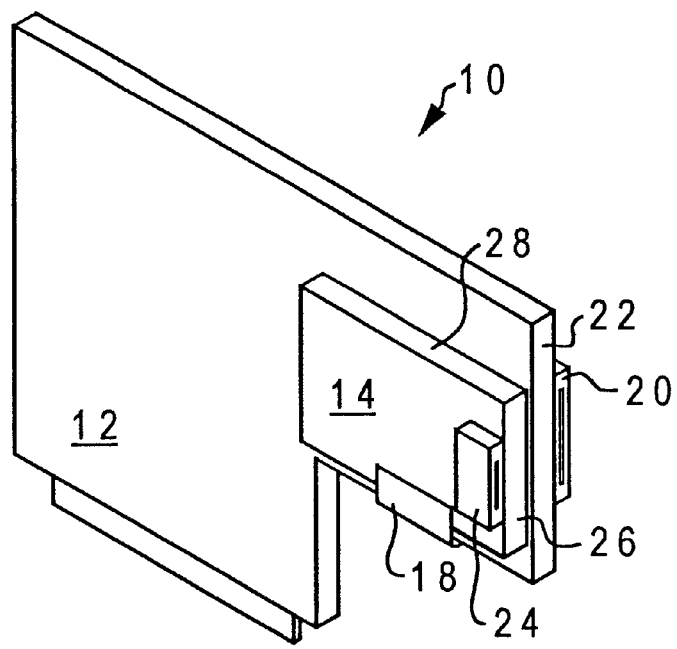
FIG. 1B depicts a perspective view of the printed circuit board of FIG. 1A having the breakaway board portion detached from the main board portion in accordance with the present invention.

FIG. 1B depicts a perspective view of the printed circuit board 10 of FIG. 1A with breakaway board portion 14 detached from main board portion 12 in accordance with the present invention. When breakaway board portion 14 is detached from main board portion 12, breakaway board portion 14 can be moved into a position parallel to main board portion 12 such that connector 20 is parallel to and horizontally level with connector 24. Ribbon connector 18 remains coupled to both main board portion 12 and breakaway board portion 14 to electrically couple the two portions together.

In one embodiment, an edge 28 is a bottom edge of breakaway board portion 14 when board 14 is attached to main board portion 12, but becomes a top edge when board 14 is detached from board 12. In this manner, the orientation of board 14 is changed. It is positioned in an upright position while it remains attached to board 12, but is flipped over into an upside down position when it is detached from board 12.

FIG. 2 illustrates a side view of the printed circuit board 10 of FIG. 1A with breakaway board portion 14 attached to main board portion 12 in accordance with the present invention.

FIG. 3 depicts front view of a first type of connector panel including a first connector and a second connector disposed vertically for coupling to a printed circuit board having a breakaway board portion attached to a main board portion in accordance with the method and system of the present invention. A first type of connector panel 30 includes a connector receptacle 32 and a connector receptacle 34. Connector receptacle 32 receives connector 20. Preferably, connector receptacle 32 is capable of receiving a VGA type connector. Connector receptacle 34 receives connector 24. Preferably, connector 34 is capable of receiving a flat panel type connector.

Connector receptacle 32 is disposed vertically, directly above connector receptacle 34. In this manner, connector panel 30 receives a single printed circuit board having two connectors, one disposed vertically above the other on an edge of the printed circuit board. Typically, panel 30 will be included within a first type of chassis for receiving a printed circuit board.

When breakaway board portion 14 remains attached to main board portion 12, connector 20 will be received through connector receptacle 32, and connector 24 will be received through connector receptacle 34. In this manner, connector 20 will protrude through connector receptacle 32 and connector 24 will protrude through connector receptacle 34 such that connectors 20 and 24 are available to be coupled to a VGA or flat panel type computer monitor.

FIG. 4 depicts a front view of a second type of connector panel including a first connector and a second connector disposed side-by-side for coupling to a printed circuit board having a breakaway board portion detached from a main board portion in accordance with the method and system of the present invention. A second type of connector panel 40 includes a connector receptacle 42 and a connector receptacle 44. Connector receptacle 42 receives connector 24. Preferably, connector receptacle 42 is capable of receiving a flat panel type connector. Connector receptacle 44 receives connector 20. Preferably, connector receptacle 44 is capable of receiving a VGA type connector.

Connector receptacle 42 is disposed in a side-by-side manner, approximately horizontally level with connector receptacle 44. In this manner, connector panel 40 is capable of receiving two separate printed circuit boards, each having a connector, where the connectors are disposed side-by-side, and approximately horizontally level with each other. Typically, panel 40 will be included within a second type of chassis for receiving a second type of printed circuit board.

When breakaway board portion 14 is detached from main board portion 12, connector 20 will be received through connector receptacle 44, and connector 24 will be received through connector receptacle 42. In this manner, connector 20 will protrude through connector receptacle 44 and connector 24 will protrude through connector receptacle 42 such that connectors 20 and 24 are available to be coupled to a VGA or flat panel type computer monitor.

The present invention is a single printed circuit board construction capable of being received within either one of two different types of chassis connector panels. A printed circuit board constructed in this manner will fit into either an NLX chassis or an ATX chassis, reducing the need for multiple card designs. No soldering or difficult re-manufacturing is necessary.

In order to adapt the board from one standard to another, the breakaway board portion must be detached from the main board portion and moved up to be parallel to the main board portion. The printed circuit board is then capable of being received by a different type of chassis connector panel.

While a preferred embodiment has been particularly shown and described, it will be understood by those skilled in the art that various changes in form and detail may be made therein without departing from the spirit and scope of the present invention.

What is claimed is:

1. A printed circuit board construction including a printed circuit board capable of being received by different types of connector panels, comprising:
   a main board portion including a first connector;
   a breakaway board portion physically coupled to said main board portion utilizing perforations, said breakaway board portion including a second connector, said breakaway board portion capable of being completely physically detached from said main board portion;
   said main board portion being electrically coupled to said breakaway board portion utilizing a flexible ribbon cable;
   a first of said different types of connector panels including a first pair of connector receptacles disposed in a first configuration for receiving said printed circuit board when said breakaway board portion remains physically attached to said main board portion; and
   a second of said different types of connector panels including a second pair of connector receptacles disposed in a second configuration for receiving said printed circuit board when said breakaway board portion is physically detached from and disposed adjacent and parallel to said main board portion.

2. The printed circuit board construction according to claim 1, wherein said first of said different types of connector panels includes said first pair of connector receptacles comprising a first connector receptacle and a second connector receptacle disposed in said first configuration, said first connector receptacle for receiving said first connector, and said second connector receptacle for receiving said second connector when said breakaway board portion is physically attached to said main board portion.

3. The printed circuit board construction according to claim 2, wherein said first configuration further comprises said first connector receptacle being disposed vertically, directly above said second connector receptacle.

4. The printed circuit board construction according to claim 3, wherein said first configuration is an AGP ATX standard configuration.

5. The printed circuit board construction according to claim 1, wherein said second of said different types of connector panels includes said second pair of connector receptacles comprising a third connector comprising a connector receptacle and a fourth connector receptacle disposed in said second configuration, said third connector receptacle for receiving said first connector, and said fourth connector receptacle for receiving said second connector when said breakaway board portion is physically detached from and disposed adjacent and parallel to said main board portion.

6. The printed circuit board construction according to claim 5, wherein said second configuration further comprises said third connector receptacle being disposed parallel to said fourth connector receptacle and approximately horizontally level with said fourth connector receptacle.

7. The printed circuit board construction according to claim 6, wherein said second configuration is an AGP NLX standard configuration.

8. A method for coupling a printed circuit board to different types of connector panels, said method comprising the steps of:
   establishing a main board portion, portion including a first connector;
   establishing a breakaway board portion, physically coupled to said main board portion utilizing perforations, said breakaway board portion including a second connector, said breakaway board portion capable of being completely physically detached from said main board portion;
   electrically coupling said main board portion to said breakaway board portion utilizing a flexible ribbon cable;
   establishing a first of said different types of connector panels including a first pair of connector receptacles disposed in a first configuration for receiving said printed circuit board when said breakaway board portion remains physically attached to said main board portion; and
   establishing a second of said different types of connector panels including a second pair of connector receptacles disposed in a second configuration for receiving said printed circuit board when said breakaway board portion is physically detached from and disposed adjacent and parallel to said main board portion.

9. The method according to claim 8, further comprising the step of establishing said first of said different types of connector panels including said first pair of connecter receptacles comprising a first connector receptacle and a second connector receptacle disposed in said first configuration, said first connector receptacle for receiving said first connector, and said second connector receptacle for receiving said second connector when said breakaway board portion remains physically attached to said main board portion.

10. The method according to claim 9, further comprising the step of establishing said first configuration including said first connector receptacle being disposed vertically, directly above said second connector receptacle.

11. The method according to claim 10, wherein said step of establishing a first configuration further comprising the step of establishing an AGP ATX standard configuration.

12. The method according to claim 8, further comprising the step of establishing said second of said different types of connector panels including said second pair of connector receptacles comprising a third connector receptacle and a fourth connector receptacle disposed in said second configuration, said third connector receptacle for receiving said first connector, and said fourth connector receptacle for receiving said second connector when said breakaway board portion is physically detached from and disposed adjacent and parallel to said main board portion.

13. The method according to claim 12, further comprising the step of establishing said second configuration including said third connector receptacle being disposed parallel said fourth connector receptacle and approximately horizontally level with said fourth connector receptacle.

14. The method according to claim 13, wherein said step of establishing said second configuration further comprises the step of establishing an AGP NLX standard configuration.

15. A printed circuit board construction including a graphics printed circuit board capable of being received by different types of connector panels, comprising:
   a main board portion including a first connector;
   a breakaway board portion physically coupled to said main board portion utilizing perforations, said breakaway board portion including a second connector, said breakaway board portion capable of being completely physically detached from said main board portion;
   said main board portion being electrically coupled to said breakaway board portion utilizing a flexible ribbon cable;
   a first of said different types of connector panels including a first connector receptacle and a second connector receptacle disposed in an AGP ATX standard configuration for receiving said graphics printed circuit board when said breakaway board portion remains physically attached to said main board portion, said first connector receptacle for receiving said first connector, and said second connector receptacle for receiving said second connector when said breakaway board portion is physically attached to said main board portion, said first connector receptacle being disposed vertically, directly above said second connector receptacle; and a second of said different types of connector panels including a third connector receptacle and a fourth connector receptacle disposed in an AGP NLX standard configuration, said third connector receptacle for receiving said first connector, and said fourth connector receptacle for receiving said second connector when said breakaway board portion is physically detached from and disposed adjacent and parallel to said main board portion, said third connector receptacle being disposed parallel to said fourth connector receptacle and approximately horizontally level with said fourth connector receptacle.

* * * * *